(12) United States Patent
Matsumoto et al.

(10) Patent No.: US 10,104,347 B2
(45) Date of Patent: Oct. 16, 2018

(54) OPTICAL DEVICE AND PROJECTOR

(71) Applicant: SEIKO EPSON CORPORATION, Tokyo (JP)

(72) Inventors: Kensaku Matsumoto, Matsumoto (JP); Kaname Nagatani, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/815,213

(22) Filed: Nov. 16, 2017

(65) Prior Publication Data

US 2018/0152679 A1    May 31, 2018

(30) Foreign Application Priority Data

Nov. 25, 2016    (JP) .................. 2016-228642

(51) Int. Cl.
| | |
|---|---|
| *H04N 9/31* | (2006.01) |
| *G03B 21/00* | (2006.01) |
| *G03B 21/20* | (2006.01) |
| *G03B 21/26* | (2006.01) |
| *G02F 1/13* | (2006.01) |
| *G03B 21/16* | (2006.01) |
| *H05K 7/20* | (2006.01) |

(52) U.S. Cl.
CPC .......... *H04N 9/3144* (2013.01); *G02F 1/13* (2013.01); *G03B 21/008* (2013.01); *G03B 21/16* (2013.01); *G03B 21/2053* (2013.01); *G03B 21/26* (2013.01); *H04N 9/3105* (2013.01); *H04N 9/3111* (2013.01); *H04N 9/3155* (2013.01); *G03B 21/2033* (2013.01); *H05K 7/20* (2013.01)

(58) Field of Classification Search
CPC ...... G02F 1/13; G03B 21/008; G03B 21/2033; G03B 21/16; G03B 21/2053; H05K 7/20; H04N 9/3105; H04N 9/3111; H04N 9/3155
USPC .................................. 349/5; 353/54
See application file for complete search history.

(56) References Cited

U.S. PATENT DOCUMENTS

| | | | |
|---|---|---|---|
| 7,320,523 B2 | 1/2008 | Ohkubo et al. | |
| 7,556,383 B2 | 7/2009 | Utsunomiya | |

(Continued)

FOREIGN PATENT DOCUMENTS

| | | |
|---|---|---|
| JP | 2005-326660 A | 11/2005 |
| JP | 2006-106250 A | 4/2006 |

(Continued)

OTHER PUBLICATIONS

Jan. 25, 2018 Office Action issued in U.S. Appl. No. 15/815,286.

*Primary Examiner* — Steven H Whitesell Gordon
*Assistant Examiner* — Jerry Brooks
(74) *Attorney, Agent, or Firm* — Oliff PLC (57) ABSTRACT

An optical device includes a light modulation device disposed on an optical axis of incident light, and a holding section configured to hold the light modulation device. The holding section includes an inflow part to which a liquid supplied from an outside of the holding section inflows, a flow channel forming part disposed along a circumferential edge of the light modulation device so as to have an annular shape, and having a flow channel through which the liquid flowed from the inflow part circulates, and an outflow part from which the liquid having flowed through the flow channel outflows to the outside of the holding section.

10 Claims, 6 Drawing Sheets

(56) References Cited

U.S. PATENT DOCUMENTS

| | | |
|---|---|---|
| 2005/0162760 A1 | 7/2005 | Fujimori et al. |
| 2005/0213018 A1 | 9/2005 | Hoshino et al. |
| 2005/0213228 A1* | 9/2005 | Fujimori ............... G03B 21/16 359/820 |
| 2005/0270495 A1 | 12/2005 | Ohkubo et al. |
| 2006/0092382 A1 | 5/2006 | Kinoshita et al. |
| 2006/0209266 A1 | 9/2006 | Utsunomiya |

FOREIGN PATENT DOCUMENTS

| | | |
|---|---|---|
| JP | 2006-259282 A | 9/2006 |
| JP | 2007-322637 A | 12/2007 |
| JP | 2011-197390 A | 10/2011 |
| JP | 2014-149510 A | 8/2014 |

* cited by examiner

OPTICAL DEVICE AND PROJECTOR

BACKGROUND

1. Technical Field

The present invention relates to an optical device and a projector.

2. Related Art

In the past, there has been known a projector which modulates light emitted from a light source device in accordance with image information to project an image on a projection surface such as a screen. Further, in recent years, there has been known a projector provided with a light source device for emitting light higher in luminance in order to make it possible to project a brighter image. Further, in such a projector, since the heat generation of an optical element, which the light emitted from the light source device enters, becomes conspicuous, there has been proposed a technology of cooling the optical element using a liquid (see, e.g., JP-A-2011-197390 (Document 1)).

The projector described in Document 1 is provided with an optical device having the optical element (a liquid crystal panel) and a liquid cooling device. In addition to the liquid crystal panel, the optical device is provided with an optical element holder for holding the liquid crystal panel.

The optical element holder is provided with a panel support frame having an opening part to support the liquid crystal panel, and a liquid circulation tube. The liquid circulation tube is bent to have a U-shape, and is formed to surround an image forming area of the liquid crystal panel in three directions in a planar view, and the liquid is circulated through the liquid circulation tube. The panel support frame is provided with an incident-side support frame and an exit-side support frame for holding the liquid circulation tube on the both sides.

The liquid cooling device is provided with a liquid pressure-feeding section, a tank, a heat exchange unit, and a plurality of liquid circulating members, and circulates the liquid through the liquid circulation tube.

However, in the technology described in Document 1, since the liquid circulation tube is formed so as to surround the image forming area of the liquid crystal panel in the three directions and thus the liquid is not circulated in one remaining direction, there is a problem that cooling becomes insufficient. Therefore, in order to improve the cooling performance, there can be cited a method of thickening the liquid circulation tube to increase the flow rate of the liquid, and a method of increasing the bending parts of the liquid circulation tube to configure the liquid circulation tube so as to surround the image forming area in roughly four directions, but there arise the following problems. That is, if the liquid circulation tube is made thicker, there is a problem that the optical element holder, and by extension, the optical device grows in size. If the number of the bending parts of the liquid circulation tube is increased, in addition to the difficulty in working the liquid circulation tube, it is necessary to circulate the liquid with high pressure, and thus, a high power device is required for the liquid pressure-feeding section, and at the same time, the pressure loss increases. If the pressure loss increases, volatilization and leakage of the liquid from a gap between connection members for circulating the liquid become apt to occur. Therefore, there is a problem that there is a possibility that the leaked liquid adheres to other members in the projector to cause a trouble, and that the liquid accumulated needs to be increased, and thus, the tank grows in size.

SUMMARY

An advantage of some aspects of the invention is to solve at least a part of the problems described above, and the invention can be implemented as the following forms or application examples.

An optical device according to this present application example includes an optical element disposed on an optical axis of incident light, and a holding section configured to hold the optical element, the holding section includes an inflow part to which a liquid supplied from an outside of the holding section inflows, a flow channel forming part disposed along a circumferential edge of the optical element so as to have an annular shape, and having a flow channel through which the liquid flowed from the inflow part circulates, and an outflow part from which the liquid having flowed through the flow channel outflows to the outside of the holding section.

According to this configuration, since in the optical device, the holding section for holding the optical element is provided with the inflow part, the flow channel forming part having the flow channel, and the outflow part described above, by supplying the liquid to the inflow part, the liquid can be circulated through the flow channel. Thus, the optical element generating the heat due to the incident light is efficiently cooled. Specifically, since the flow channel is configured to have an annular shape along the circumferential edge of the optical element, it becomes possible to transfer the heat of the optical element from the area surrounding the optically effective area where the light of the optical element enters to the liquid. Further, since the members intervening between the optical element and the liquid are reduced compared to the configuration of circulating the liquid using other members (e.g., pipe-like members) than the holding section, it becomes possible to efficiently transfer the heat of the optical element to the liquid.

Therefore, since the rise in temperature of the optical element can efficiently be suppressed, the deterioration of the optical element is suppressed, and it becomes possible to provide the optical device capable of surely exerting the optical characteristics provided to the optical element.

Further, since the optical device can be formed of a smaller number of components compared to the configuration of circulating the liquid using other embers than the holding sections, it becomes possible to provide the optical device making it possible to reduce the manufacturing man-hour and the component cost and to reduce the device size.

In the optical device according to the application example described above, it is preferable that the flow channel forming part is disposed on a light incident side of the optical element, and the flow channel is disposed so as to at least partially overlap the optical element in a direction along the optical axis.

According to this configuration, since the flow channel forming part is disposed on the light incident side of the optical element, the flow channel forming part is also irradiated with a part of the light propagating toward the optical device. Further, since the flow channel is disposed as described above, it results that at least a part of the flow channel, namely the liquid, intervenes between the region (the irradiated part) irradiated with the light of the flow channel forming part and the optical element. Thus, it becomes hard for the heat of the irradiated part (the flow channel forming part) generating the heat due to the light with which the irradiated part is irradiated to be transferred to the optical element. Therefore, it becomes possible to provide the optical device in which the heat generation of the optical element is further suppressed.

In the optical device according to the application example described above, it is preferable that the flow channel includes a first flow channel part configured to circulate, in a first direction, a part of the liquid flowed from the inflow part, a second flow channel part configured to circulate, in a second direction crossing the first direction, a rest of the liquid flowed from the inflow part, a third flow channel part configured to circulate, in the second direction, a liquid flowed through the first flow channel part, and a fourth flow channel part configured to circulate, in a third direction opposite to the first direction, a liquid flowed through the third flow channel part, and the outflow part outflows a liquid obtained by combining a liquid circulated through the second flow channel part and a liquid circulated through the fourth flow channel part.

According to this configuration, the flow channel having an annular shape is constituted by the first flow channel part through the fourth flow channel part. Thus, with respect to the optical element having the optically effective area having a rectangular shape, it becomes possible to dispose the flow channel closely to the optically effective area. Therefore, since it becomes possible to more efficiently transfer the heat of the optical element to the liquid, it becomes possible to provide the optical device capable of more strongly suppressing the rise in temperature of the optical element.

Further, since it becomes possible to form the inflow part and the outflow part on the same side (on the third direction side) with respect to the flow channel forming part, it becomes possible to compactly dispose the members to be connected respectively to the inflow part and the outflow part in order to circulate the liquid through the flow channel. Therefore, it becomes possible to provide the optical device capable of making a contribution to the miniaturization of a device and equipment equipped with the optical device.

In the optical device according to the application example described above, it is preferable that the holding section includes a first frame and a second frame disposed so as to be opposed to each other in a direction along the optical axis, and the flow channel is formed of the first frame and the second frame bonded to each other.

According to this configuration, it is possible to form the holding section having the flow channel by providing a recessed part to at least either one of the first frame and the second frame and then connecting the first frame and the second frame to each other. Therefore, even in the configuration of having the flow channel through which the liquid circulates, it is possible to form the holding section with easy working, and while suppressing the increase in manufacturing man-hour.

In the optical device according to the application example described above, it is preferable that the first frame includes a first frame part having a first opening part through which the light passes, and extending in a direction crossing the optical axis, and a first uprise part formed so as to rise from an edge part of the opening part toward the second frame, the second frame includes a second frame part having a second opening part into which the first uprise part is inserted, and disposed so as to be opposed to the first frame part via a space, and a second uprise part formed so as to rise from an edge part of the second opening part toward the first frame, and disposed so as to overlap the first uprise part in a direction crossing the optical axis, the flow channel is disposed between the first frame part and the second frame part, and the second uprise part constitutes an inner circumference of the flow channel forming part having the annular shape.

According to this configuration, the inner circumferential edge of the flow channel forming part having an annular shape is formed of the first uprise part and the second uprise part stacked on the outer periphery of the first uprise part, and the flow channel is disposed on the outer side of the second uprise part. Thus, even if the thickness of the first uprise part and the thickness of the second uprise part are made thinner, it becomes possible to surely connect the first uprise part and the second uprise part to each other. Therefore, it becomes possible to form the flow channel closely to the optically effective area of the optical element. Therefore, even in the configuration of forming the holding section with the two members, it becomes possible to provide the optical device in which the optical element is efficiently cooled while easily forming the flow channel.

In the optical device according to the application example described above, it is preferable that the first frame and the second frame are bonded to each other with one of brazing and welding.

According to this configuration, the first frame and the second frame are surely bonded to each other, and it becomes possible to form the holding section while suppressing the growth in size.

In the optical device according to the application example described above, it is preferable that the optical element is a light modulation device configured to modulate the incident light.

According to this configuration, since the light modulation device as the optical element is efficiently cooled by the liquid having flowed into the holding section, and is therefore prevented from rising in temperature. Therefore, it becomes possible to provide the optical device provided with the optical element for exerting the own optical characteristics for a long period of time to modulate the incident light.

A projector according to this application example includes a light source configured to emit light, the optical device according to any one of the application examples described above, which the light emitted from the light source enters, a projection optical device configured to project an image corresponding to light emitted from the optical device, and a liquid cooling device configured to circulate the liquid through the optical device.

According to this configuration, since the projector is provided with the optical device described above and the liquid cooling device, even in the configuration provided with the light source for emitting high-intensity light, the optical element is efficiently cooled, and projection of bright images and images good in quality becomes possible for a long period of time.

Further, since the degree of freedom of the shape of the flow channel can be increased compared to the configuration of circulating the liquid using other members than the holding section, it becomes possible to circulate the liquid with low pressure. Thus, it becomes possible to achieve miniaturization and reduction in power of the device (e.g., a pump) provided to the liquid cooling device for circulating the liquid.

Further, since it is possible to circulate the liquid with low pressure, it becomes possible to prevent the volatilization and the leakage of the liquid from the connection section between the holding section and the liquid cooling device for circulating the liquid through the optical device, and the connection section in the liquid cooling device. Thus, it is possible to prevent the liquid from adhering to other members in the projector, and at the same time it becomes possible to adopt a configuration provided with a small amount of liquid. Therefore, it becomes possible to provide the projector equipped with the liquid cooling device small in size and low in power consumption.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A projector according to the embodiment of the invention will hereinafter be described with reference to the accompanying drawings.

The projector according to the present embodiment modulates the light, which has been emitted from a light source, in accordance with image information, and then projects the light thus modulated on a projection surface such as a screen in an enlarged manner.

Principal Configuration of Projector

Figure 1:
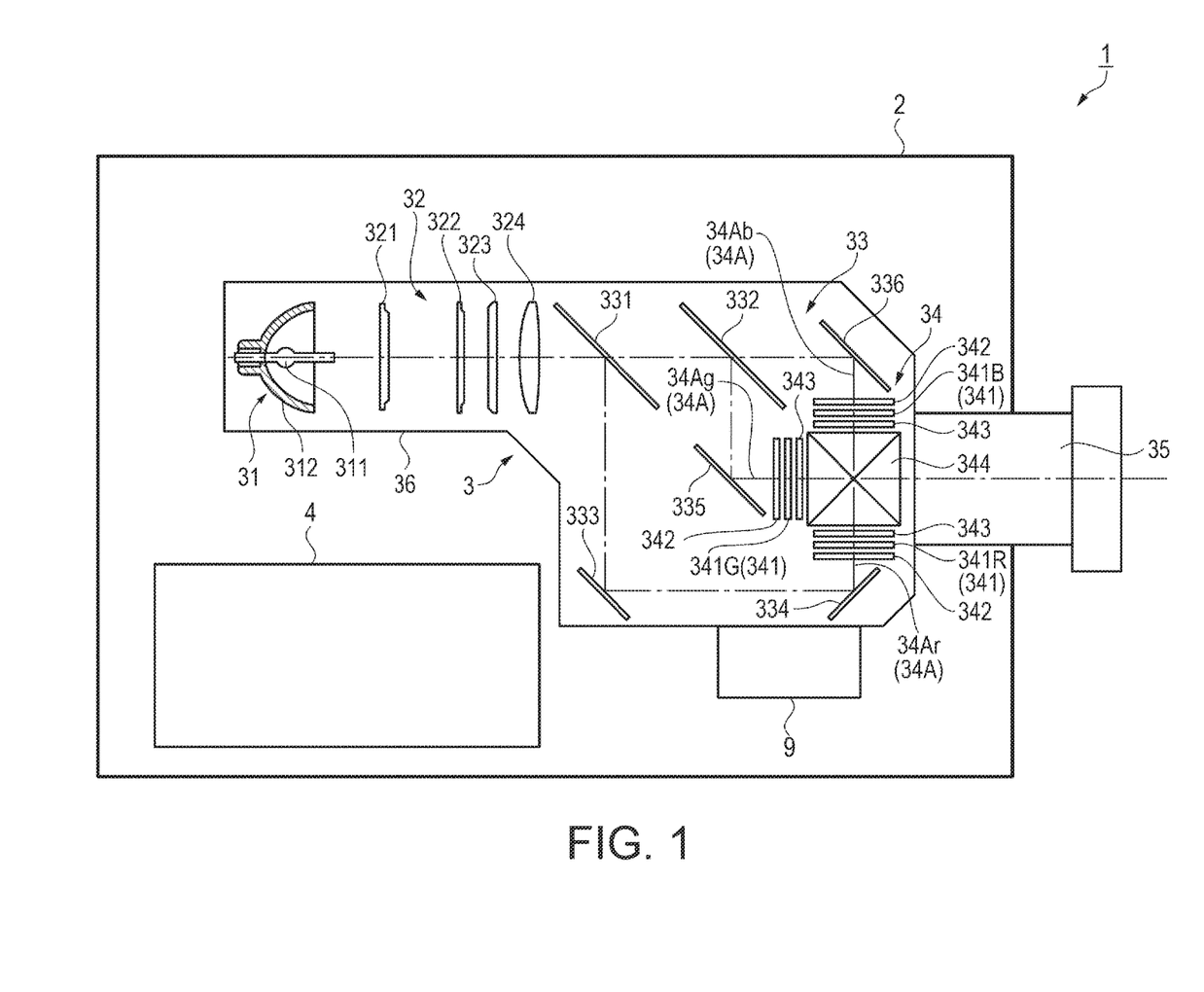
FIG. 1 is a schematic diagram showing a schematic configuration of a projector according to an embodiment of the invention.

FIG. 1 is a schematic diagram showing a principal configuration of the projector 1 according to the present embodiment.

As shown in FIG. 1, the projector 1 is provided with an exterior housing 2 constituting the exterior, a control section (not shown), an optical unit 3 including a light source device 31, a liquid cooling device 4, and an air cooling device 9. It should be noted that although not shown in the drawings, the projector 1 is provided with a power supply device for supplying power to the light source device 31, the control section, and so on, an exhaust device for discharging the air heated in the exterior housing 2 to the outside, and so on.

Although not shown in detail in the drawings, the exterior housing 2 is formed of a plurality of members combined with each other. Further, although not shown in the drawings, the exterior housing 2 is provided with an air intake port for taking in the external air, an exhaust port for discharging the heated air located inside the exterior housing 2 to the outside, and so on.

The control section is provided with a central processing unit (CPU), a read only memory (ROM), a random access memory (RAM), and so on to thereby function as a computer, and performs control of the operation of the projector 1 such as control related to projection of an image and control related to drive of the liquid cooling device 4 and the air cooling device 9.

The optical unit 3 optically processes the light emitted from the light source device 31 and then projects the result under the control by the control section.

As shown in FIG. 1, the optical unit 3 is provided with an integrator illumination optical system 32, a color separation optical system 33, an electro-optic device 34 having light modulation devices 341 described later, a cross dichroic prism 344 as a color combining optical device, a projection optical device 35, and an optical component housing 36 for arranging these optical components at predetermined positions on the optical path in addition to the light source device 31.

The light source device 31 is provided with the light source 311 of a discharge type formed of, for example, a super-high pressure mercury lamp or a metal halide lamp, a reflector 312, and so on. The light source device 31 reflects the light emitted from the light source 311 with the reflector 312 to emit the light toward the integrator illumination optical system 32.

The integrator illumination optical system 32 is provided with a first lens array 321, a second lens array 322, a polarization conversion element 323, and an overlapping lens 324.

The first lens array 321 has a configuration having small lenses arranged in a matrix, and divides the light emitted from the light source device 31 into a plurality of partial light beams. The second lens array 322 has substantially the same configuration as that of the first lens array 321, and roughly overlaps the partial light beams on a surface of each of the light modulation devices 341 in cooperation with the overlapping lens 324. The polarization conversion element 323 has a function of aligning the randomly polarized light emitted from the second lens array 322 into a substantially single polarized light available to the light modulation devices 341.

The color separation optical system 33 is provided with dichroic mirrors 331, 332, and reflecting mirrors 333 through 336, and has a function of separating the light emitted from the integrator illumination optical system 32 into three colors of light of red light (hereinafter referred to as "R light"), green light (hereinafter referred to as "G light"), and blue light (hereinafter referred to as "B light"), and then guiding the three colors of light to the respective light modulation devices 341.

The electro-optic device 34 is provided with the three light modulation devices 341 provided for the respective colored light, incident-side polarization plates 342 and exit-side polarization plates 343 respectively disposed on the light incident side and the light exit side of the respective light modulation devices 341, holding sections 5 (see FIG. 2) for holding the respective light modulation devices 341, and a support section not shown. The light modulation device for the R light is denoted by 341R, the light modulation device for the G light is denoted by 341G, and the light modulation device for the B light is denoted by 341B. The light modulation devices 341R, 341G, and 341B, and the incident-side polarization plates 342, and the exit-side polarization plates 343 for the respective colored light are disposed respectively on the optical axes 34A (the optical axis for the R light is denoted by 34Ar, the optical axis for the G light is denoted by 34Ag, and the optical axis for the B light is denoted by 34Ab) of the respective colored light emitted from the color separation optical system 33. The light modulation devices 341 correspond to the optical elements disposed on the optical axes 34A of the incident light, respectively. Further, the holding section 5 and the light modulation device 341 held by the holding section 5 are defined as an optical device 50.

Figure 2:
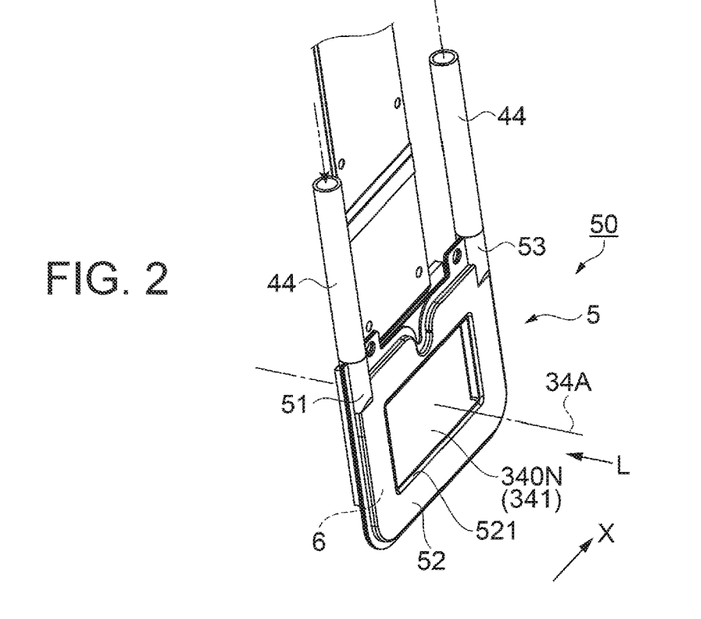
FIG. 2 is a perspective view of an optical device according to the embodiment, and tubular members connected to a holding section of the optical device viewed from a light incident side.
Figure 3:
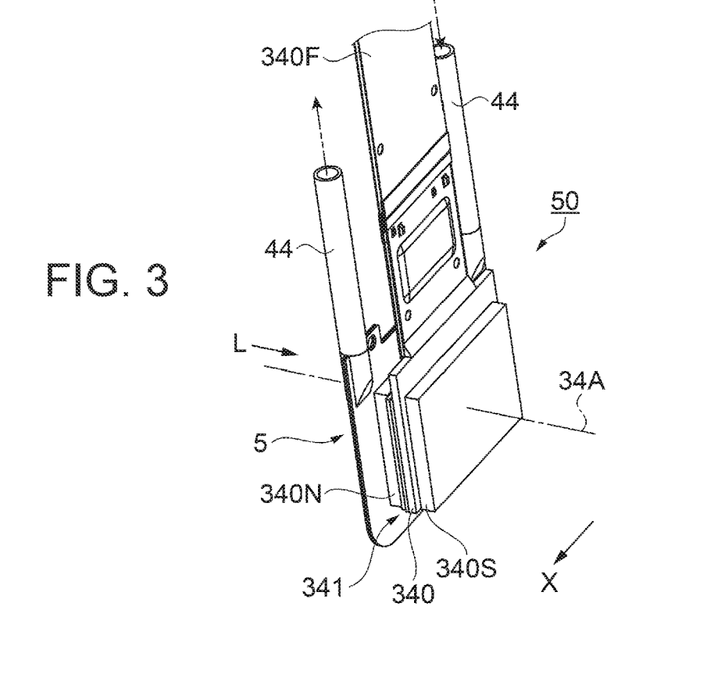
FIG. 3 is a perspective view of a member having the same configuration as shown in FIG. 2 viewed from a light exit side.

FIG. 2 is a perspective view of the optical device 50 and tubular members 44 described later connected to the holding section 5 of the optical device 50 viewed from the light incident side. FIG. 3 is a perspective view of a member having the same configuration as shown in FIG. 2 viewed from the light exit side.

As shown in FIG. 3, each of the light modulation devices 341 is provided with a liquid crystal panel 340 of a transmissive type, dustproof glass members 340N, 340S, and a flexible board 340F.

The liquid crystal panel 340 has an image forming area (not shown) having a rectangular shape in which liquid crystal is airtightly encapsulated between an element substrate made of glass or the like and an opposed substrate disposed so as to be opposed to the element substrate, and minute pixels are formed in a matrix. The image forming area forms an optically effective area for forming an image.

The dustproof glass member 340N is disposed on a light incidence-side surface of the liquid crystal panel 340, and the dustproof glass 340S is disposed on a light exit-side surface of the liquid crystal panel 340.

The dustproof glass members 340N, 340S are formed of, for example, quartz glass, sapphire, or quartz crystal, and prevent the dust from adhering to the surface of the liquid crystal panel 340. Thus, even if the dust adheres to the dustproof glass member 340N or the dustproof glass member 340S, the position of the dust is shifted from the focal position, and therefore, it is arranged to prevent the shadow of the dust from becoming conspicuous in the image projected.

The flexible board 340F is connected to the element substrate of the liquid crystal panel 340 at one end, and is connected to the control section at the other end. In the light modulation device 341, a drive signal corresponding to the image information is input from the control section via the flexible board 340F, the orientational state of the liquid crystal in the image forming area is controlled, and thus, the incident colored light is modulated.

As shown in FIG. 2, the holding section 5 is provided with an opening part 521 through which the light L emitted from the incident-side polarization plate 342 (see FIG. 1) passes. The light modulation device 341 of the embodiment is fixed to the holding section 5 with an adhesive. The holding sections 5 for respectively holding the light modulation devices 341R, 341G, and 341B are denoted by 5R, 5G, and 5B. Although described later in detail, inside the holding section 5, there is disposed a flow channel 6 through which the liquid supplied from the liquid cooling device 4 circulates. Further, the light modulation device 341 is cooled by the liquid circulating between the holding section 5 and the liquid cooling device 4. The holding section 5 will be described later in detail.

Although not described in detail, the support section is formed of a metal sheet or the like, supports the optical device 50, and is attached to the cross dichroic prism 344.

The cross dichroic prism 344 has a substantially rectangular planar shape composed of four rectangular prisms bonded to each other, and on the interfaces on which the rectangular prisms are bonded to each other, there are formed two dielectric multilayer films. In the cross dichroic prism 344, the dielectric multilayer films reflect the R light and the B light modulated by the light modulation devices 341R, 341B while transmitting the G light modulated by the light modulation device 341G to thereby combine the three colors of modulated light with each other.

The projection optical device 35 is provided with a plurality of lenses, and projects the light, which has been combined by the cross dichroic prism 344, on the screen in an enlarged manner.

The liquid cooling device 4 circulates the liquid with the holding section 5 of the optical device 50 to cool the light modulation device 341.

Figure 4:
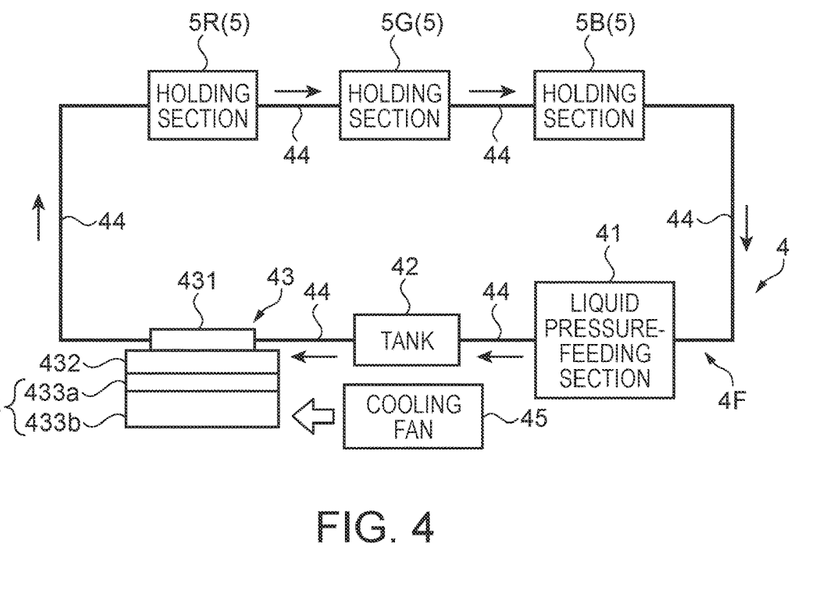
FIG. 4 is a diagram schematically showing a principal configuration of a liquid cooling device in the embodiment.

FIG. 4 is a diagram schematically showing the principal configuration of the liquid cooling device 4.

As shown in FIG. 4, the liquid cooling device 4 is provided with a liquid pressure-feeding section 41, a tank 42, a heat exchange device 43, a plurality of tubular members 44, and a cooling fan 45. The liquid pressure-feeding section 41, the tank 42, the heat exchange device 43, and the plurality of tubular members 44 form a circulation channel 4F, through which the liquid circulates, in cooperation with the holding sections 5.

The liquid pressure-feeding section 41 is a pump for sucking and pressure-feeding the liquid, and has a suction port for sucking the liquid and an outflow port through which the liquid is pressure-fed. Further, the liquid pressure-feeding section 41 circulates the liquid through the circulation channel 4F.

The tank 42 is formed of a metal material such as aluminum so as to have a hollowed shape with an inflow port through which the liquid inflows, and an outflow port through which the liquid outflows. Further, the tank 42 temporarily stores the liquid inside, and then supplies the liquid to the circulation channel 4F. It should be noted that as the liquid used for the embodiment, there can be cited water, ethylene glycol, and so on.

As shown in FIG. 4, the heat exchange device 43 is provided with a heat receiving section 431, a heat exchange element 432, and a heat radiation section 433.

The heat receiving section 431 is provided with a plurality of minute channels (not shown) through which the liquid circulates, an inflow port and an outflow port communicated with the channels, and has a structure of a heat exchanger such as a so-called micro-channel. Further, the heat receiving section 431 receives the heat from the liquid inflowing through the inflow port and flowing through the minute channels.

The heat exchange element 432 is provided with, for example, a Peltier device having a heat absorbing section and a heat generating section, and the heat absorbing section is connected to the heat receiving section 431. When the power is supplied to the heat exchange element 432, the heat absorbing section absorbs the heat of the heat receiving section 431, and the heat generating section generates the heat.

The heat radiation section 433 is a so-called heatsink, and is formed of a metal material such as aluminum, and has a base part 433a having a plate-like shape, and a plurality of fins 433b (one of the fins 433b is shown in FIG. 4) projecting from one surface of the base part 433a. The base part 433a of the heat radiation section 433 is connected to the heat generating section of the heat exchange element 432 to radiate the heat of the heat generating section.

The cooling fan 45 feeds air to the heat radiation section 433 to promote the heat radiation by the heat radiation section 433.

The plurality of tubular members 44 is formed to have a tubular shape, through which the liquid flows, using a material having flexibility, and circularly connects the respective members (the holding sections 5R, 5G, and 5B, the liquid pressure-feeding section 41, the tank 42, and the heat receiving section 431) as shown in FIG. 4 to form the circulation channel 4F together with these members. It should be noted that although in FIG. 4, there is shown the configuration in which the three holding sections 5 (the holding sections 5R, 5G, and 5B) are connected in series to each other, there can also be adopted a configuration in which the three holding sections 5 are connected in parallel to each other. Further, although in FIG. 4, the three holding sections 5 are connected to each other so that the liquid flows through the holding sections 5R, 5G, and 5B in this order, this order is not a limitation.

Although not shown in detail, the air cooling device 9 is provided with a blower fan, a duct member for guiding the air fed by the blower fan to the electro-optic device 34, and so on, and cools the optical components such as the light modulation devices 341, the incident-side polarization plates 342, and the exit-side polarization plates 343. Therefore, the light modulation devices 341 are cooled by the liquid cooling device 4 and the air cooling device 9.

Configuration of Holding Sections

Here, the holding sections 5 in the optical device 50 will be described in detail. The holding sections 5R, 5G, and 5B have a common configuration, and the description will be provided focusing attention on one of the holding sections 5.

Figure 5:
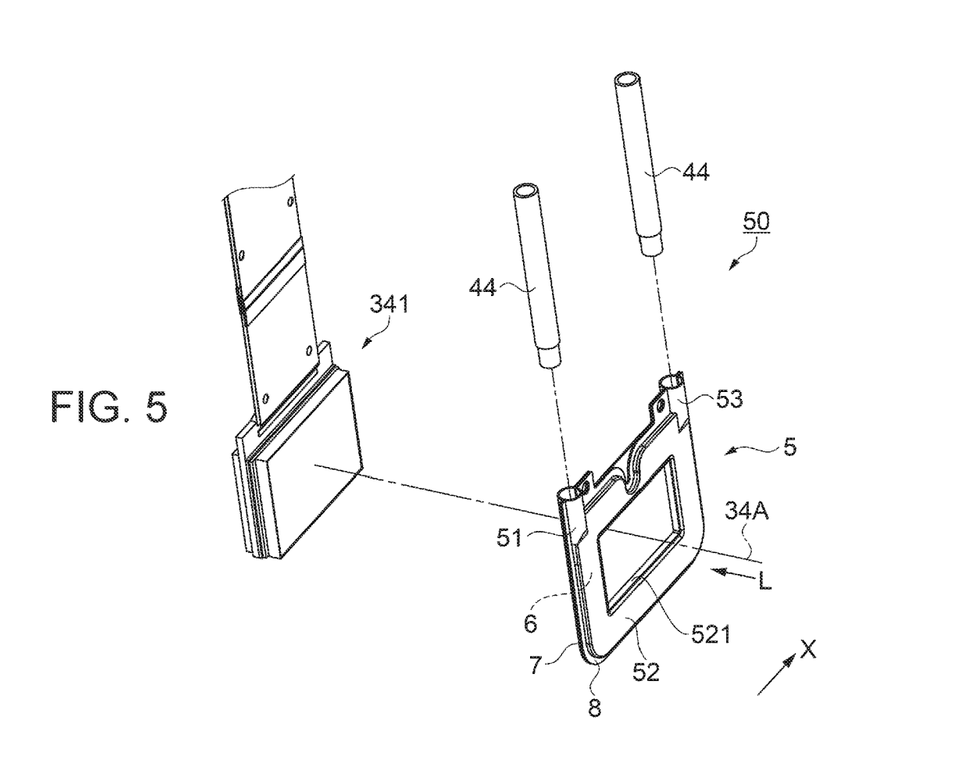
FIG. 5 is an exploded perspective view of the optical device according to the embodiment, and the tubular members connected to the holding section.
Figure 6:
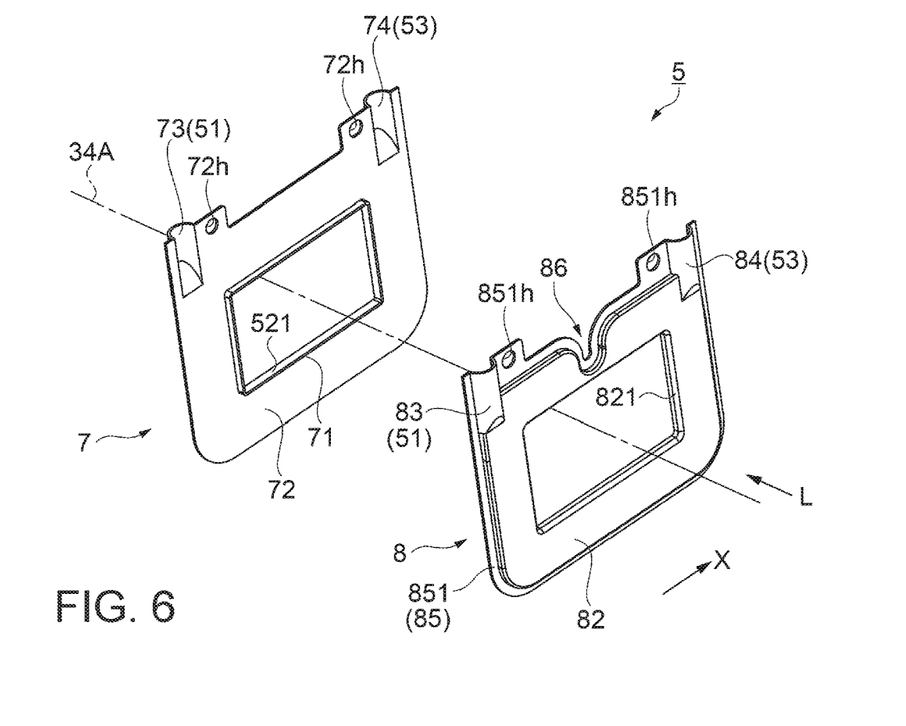
FIG. 6 is an exploded perspective view of the holding section of the embodiment.
Figure 7:
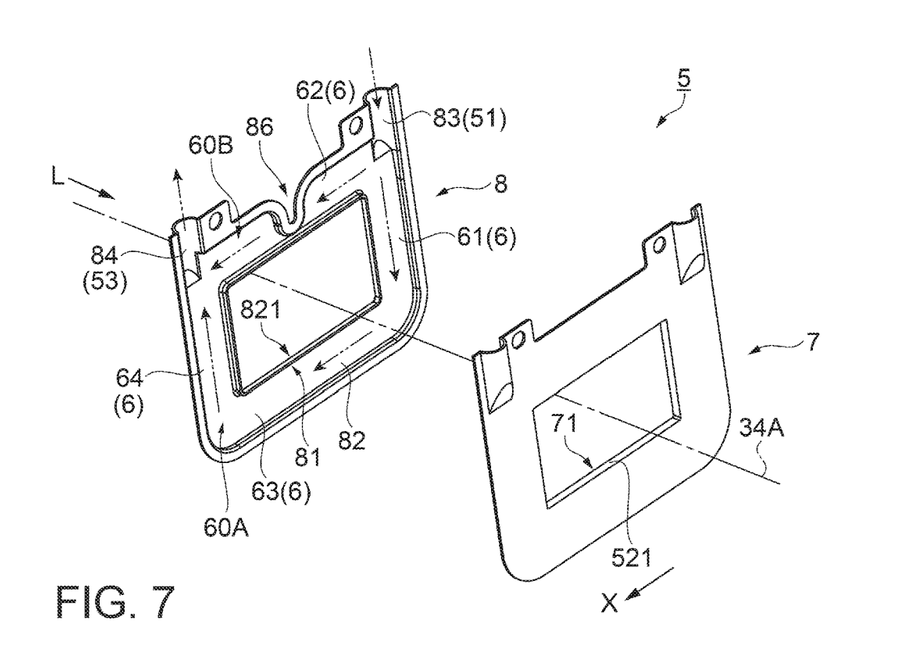
FIG. 7 is an exploded perspective view of the holding section of the embodiment.

FIG. 5 is an exploded perspective view of the optical device 50 and tubular members 44 connected to the holding section 5, and is a diagram viewed from the light incident side. FIG. 6 is an exploded perspective view of the holding section 5 viewed from the light incident side. FIG. 7 is an exploded perspective view of the holding section 5 viewed from the light exit side.

The holding section 5 is constituted by a first frame 7 and a second frame 8, each of which is formed using press working from a metal sheet made of aluminum or the like, and which are bonded to each other. As shown in FIG. 5 through FIG. 7, the first frame 7 and the second frame 8 are disposed so as to be opposed to each other in a direction along the optical axis 34A. Further, the holding section 5 is disposed on the light incident side of the light modulation device 341 so that the first frame 7 is located on the light modulation device 341 side and the second frame 8 is located on the opposite side of the first frame 7 to the light modulation device 341.

As shown in FIG. 5 and FIG. 6, the holding section 5 is formed to have a rectangular outer shape viewed from the direction along the optical axis 34A, and has an inflow part 51, a flow channel forming part 52, and an outflow part 53.

The inflow part 51 and the outflow part 53 are disposed on one side in the holding section 5 having the rectangular shape. It should be noted that the description will hereinafter be presented defining the side in the holding section 5, on which the inflow part 51 and the outflow part 53 are disposed, as an "upper side," and the right side of the holding section 5 viewed from the light incident side in the posture, in which the inflow part 51 and the outflow part 53 are on the upper side, as a "right side" (+X side) for the sake of convenience of explanation.

The inflow part 51 is disposed in the vicinity (the left side (−X side) in the embodiment) of one end part on the upper side of the holding section 5. The inflow part 51 is formed to have a cylindrical shape so that the tubular member 44 is connected thereto and the liquid from the liquid cooling device 4 inflows thereto.

The flow channel forming part 52 is circularly disposed along the circumferential edge of the light modulation device 341. The inner circumferential edge of the flow channel forming part 52 having the annular shape forms the opening part 521 through which the light L passes. The flow channel forming part 52 is formed so as to surround the optically effective area having a rectangular shape of the liquid crystal panel 340 viewed from the light incident side, and the flow channel 6 though which the liquid from the inflow part 51 circulates is disposed inside the flow channel forming part 52.

The outflow part 53 is disposed in the vicinity (the right side (+X side) in the embodiment) of the other end part on the upper side of the holding section 5. The outflow part 53 is formed to have a cylindrical shape so that the tubular member 44 is connected thereto and the liquid having flowed through the flow channel 6 outflows therefrom. As described above, the inflow part 51 and the outflow part 53 are disposed on the same side (the upper side) with respect to the flow channel forming part 52. It should be noted that a part of the duct member (not shown) in the air cooling device 9 is disposed on the opposite side to the inflow part 51 and the outflow part 53 of the holding section 5, namely below the electro-optic device 34.

Here, the shapes of the first frame 7 and the second frame 8 will be described in detail.

As shown in FIG. 6 and FIG. 7, the first frame 7 has a first frame part 72, a first uprise part 71, and recessed parts 73, 74.

The first frame part 72 has an opening part along the inner circumferential edge of the flow channel forming part 52 having an annular shape, and extends in a direction crossing the optical axis 34A.

As shown in FIG. 6 and FIG. 7, the first uprise part 71 rises from the edge part of the opening part in the first frame part 72 toward the second frame 8.

The first uprise part 71 forms the inner circumferential edge of the flow channel forming part 52 having an annular shape, namely the edge part of the opening part 521 (see FIG. 5) of the holding section 5.

The recessed part 73 is a region forming a part of the inflow part 51, and is disposed on the upper left side of the first frame part 72, and has a shape having a semicylindrical recess on the second frame 8 side as shown in FIG. 6. The recessed part 74 is a region forming a part of the outflow part 53, and is disposed on the upper right side of the first frame part 72, and has a shape having a semicylindrical recess on the second frame 8 side as shown in FIG. 6.

Further, the first frame part 72 is provided with positioning holes 72h respectively located in the vicinities of the recessed parts 73, 74.

As shown in FIG. 6 and FIG. 7, the second frame 8 has a second frame part 82, a second uprise part 81, recessed parts 83, 84, and an outer circumferential edge part 85.

Figure 8:
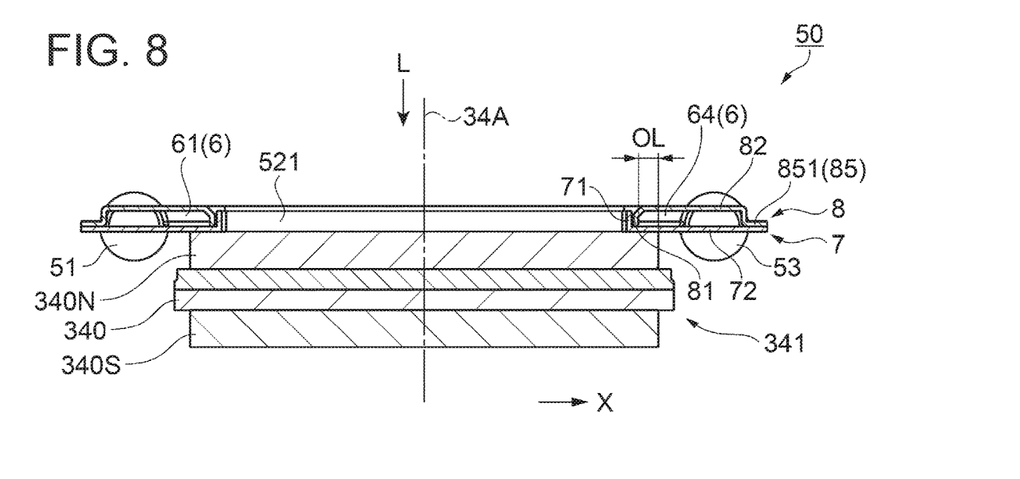
FIG. 8 is a cross-sectional view of the optical device according to the embodiment.
Figure 9:
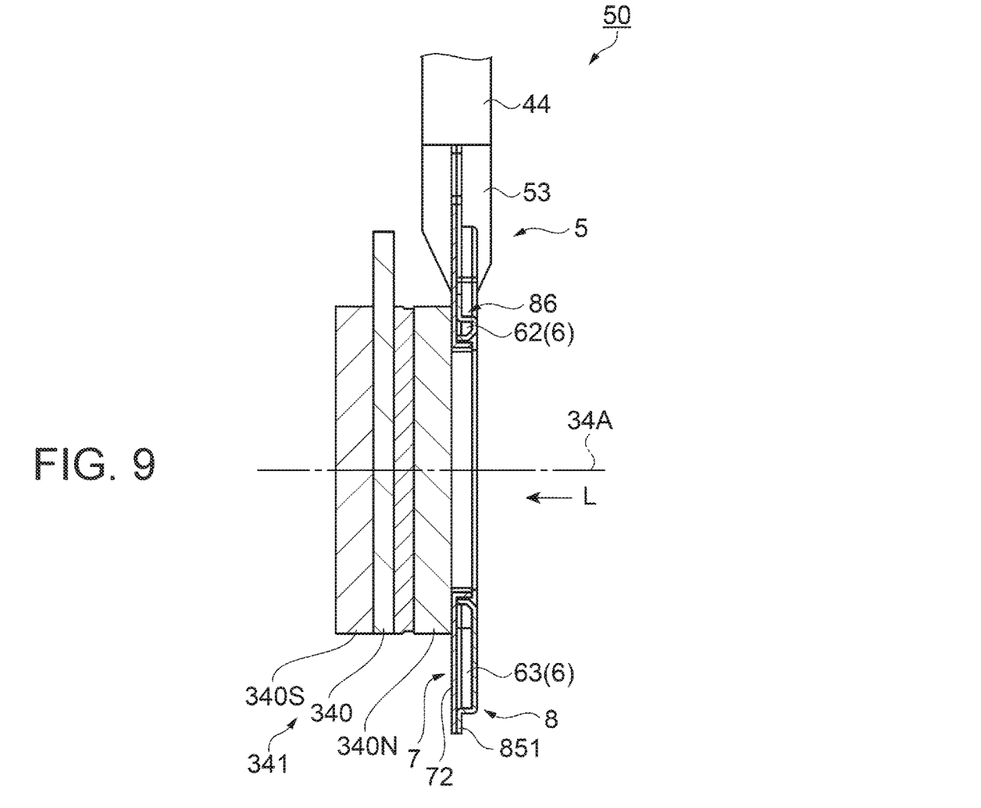
FIG. 9 is a cross-sectional view of the optical device according to the embodiment.

FIG. 8 is a cross-sectional view of the optical device 50 viewed from below. FIG. 9 is a cross-sectional view of the optical device 50 viewed from the left (the −X direction).

The second frame part 82 has an insertion opening part 821 to which the first uprise part 71 can be inserted as shown in FIG. 6, and is formed so as to be opposed to the first frame part 72 via a space as shown in FIG. 8.

The second uprise part 81 is formed so as to rise from the edge part of the insertion opening part 821 toward the first frame 7 to have a rectangular planar shape as shown in FIG. 7, and is formed so as to be stacked on the outer periphery of the first uprise part 71, namely on the opposite side to the opening part 521 of the first uprise part 71 as shown in FIG. 8.

The recessed part 83 is disposed at a position opposed to the recessed part 73 of the first frame 7, and has a shape having a semicylindrical recess on the first frame 7 side. Further, the recessed part 83 forms the inflow part 51 together with the recessed part 73.

The recessed part 84 is disposed at a position opposed to the recessed part 74 of the first frame 7, and has a shape having a semicylindrical recess on the first frame 7 side. Further, the recessed part 84 forms the outflow part 53 together with the recessed part 74.

The outer circumferential part 85 is a region bent toward the first frame 7 with respect to the second frame part 82, and is formed at the end part on the outer periphery other than the upper side of the recessed parts 83, 84 as shown in FIG. 6. Further, as shown in FIG. 8 and FIG. 9, the outer circumferential edge part 85 is provided with an end part 851 formed flatly so as to be stacked on the first frame part 72. The end part 851 is provided with positioning holes 851h corresponding respectively to the two positioning holes 72h of the first frame part 72.

Further, as shown in FIG. 6 and FIG. 7, the second frame 8 is provided with a narrowed part 86.

The narrowed part 86 is disposed on the upper side (a second flow channel part 62 described later) of the second uprise part 81, and is formed so that the distance between the second uprise part 81 and the outer circumferential edge part 85 on the upper side is partially narrowed in the vertical direction, namely so that the outer circumferential edge part 85 on the upper side partially comes closer to the second uprise part 81.

The first frame 7 and the second frame 8 are positioned to each other by a jig inserted into the positioning holes 72h, 851h, and then the first frame part 72 and the end part 851, and the first uprise part 71 and the second uprise part 81 are each bonded to each other with, for example, brazing or welding. Further, the first frame 7 and the second frame 8 are connected to each other to thereby form the holding section 5 having the inflow part 51, the flow channel forming part 52, and the outflow part 53. Further, the holding section 5 is sealed except the upper side of the inflow part 51 and the outflow part 53, and the flow channel 6 communicated with the inflow part 51 and the outflow part 53 is disposed in the flow channel forming part 52. As shown in FIG. 8, the flow channel 6 is formed between the first frame part 72 and the second frame part 82, and outside the second uprise part 81 and inside the end part 851 to have an annular shape. As described above, the flow channel 6 is formed of the first frame 7 and the second frame 8 bonded to each other.

Further, the flow channel forming part 52 is formed to have the thickness, namely the size in a direction along the optical axis 34A, smaller than the size (the outer diameter dimension) of the inflow part 51 and the outflow part 53. Further, as shown in FIG. 8, the holding section 5 is disposed so that the first frame part 72 of the first frame 7 is opposed to the light modulation device 341. The dustproof glass member 340N of the light modulation device 341 is fixed to the first frame part 72 via an adhesive.

As shown in FIG. 8, the flow channel 6 is disposed so as to partially overlap the light modulation device 341 viewed from the direction along the optical axis 34A. Specifically, the flow channel 6 is disposed having an overlap OL from the end part of the light modulation device 341.

Here, the flow channel 6, and the flow of the liquid fed from the liquid cooling device 4 are described in detail using FIG. 7.

As shown in FIG. 7, the flow channel 6 has a first flow channel part 61, a second flow channel part 62, a third flow channel part 63, and a fourth flow channel part 64 arranged to form an annular shape.

The first flow channel part 61 is disposed on the left (-X direction) side of the opening part 521 and below the inflow part 51, and extends downward. The second flow channel part 62 is disposed above the opening part 521, and extends rightward (in the +X direction) from a position below the inflow part 51. The third flow channel part 63 is disposed below the opening part 521, and extends rightward (in the +X direction) from a position below the first flow channel part 61. The fourth flow channel part 64 is disposed on the right (+X direction) side of the opening part 521, and extends upward from a position on the right (+X direction) side of the third flow channel part 63. Further, the second flow channel part 62 is connected to the upper part of the fourth flow channel part 64.

The liquid fed from the liquid cooling device 4 circulates through the flow channel 6 from the inflow part 51, and then outflows to the outside of the holding section 5, namely to the liquid cooling device 4, from the outflow part 53. Specifically, the liquid inflows from the inflow part 51 is partially branched downward by the first flow channel part 61, and the rest separately flows through the second flow channel part 62 in the rightward direction (+X direction) crossing the downward direction as shown in FIG. 7.

Then, the liquid having flowed through the first flow channel part 61 is changed in the direction by the third flow channel part 63 to circulate rightward (in the +X direction). The liquid having flowed through the third flow channel part 63 is changed in the direction by the fourth flow channel part 64 to circulate upward, and is then combined with the liquid having flowed through the second flow channel part 62. The liquid having flowed through the fourth flow channel part 64 outflows from the outflow part 53 toward the liquid cooling device 4. The downward direction corresponds to a first direction, and the right ward direction corresponds to a second direction. Further, the upward direction opposite to the downward direction (the first direction) corresponds to a third direction.

As described above, the liquid having flowed from the inflow part 51 flows through a first path 60A in which the liquid flows along the first flow channel part 61, the third flow channel part 63, and the fourth flow channel part 64, and a second path 60B in which the liquid flows along the second flow channel part 62 and is then combined with the liquid having flowed through the fourth flow channel part 64, and then outflows from the outflow part 53 toward the liquid cooling device 4.

The light modulation device 341 is cooled by the liquid circulating through the flow channel 6. Specifically, the heat of the light modulation device 341 generating the heat due to the incident light is transferred to the liquid via the first frame 7. Further, since the flow channel 6 is formed along the circumferential edge of the light modulation device 341 so as to form an annular shape, the heat of the light modulation device 341 is transferred to the liquid from the area surrounding the optically effective area (an image forming area) of the light modulation device 341. Then, the liquid having flowed out from the holding sections 5R, 5G, and 5B disposed in series inflows into the heat exchange device 43 along the circulation channel 4F. The liquid having flowed into the heat exchange device 43 is cooled by the heat exchange device 43 absorbing the heat of the liquid. Then, the liquid having been cooled by the heat exchange device 43 inflows again into the holding section 5 (the holding section 5R in the present embodiment) to cool the light modulation device 341. As described above, the heat having been absorbed by the heat exchange device 43 is radiated from the heat radiation section 433 of the heat exchange device 43. Then, the heat radiated from the heat radiation section 433 is discharged to the outside of the projector 1 through the exhaust port of the exterior housing 2 by the exhaust device not shown.

Further, since the holding section 5 is disposed on the light incident side of the light modulation device 341, the holding section 5 is also irradiated with a part (e.g., leakage light propagating toward the outside of the optically effective area of the light modulation device 341) of the light propagating toward the optical device 50. However, since the flow channel 6 is disposed having the overlap OL (see FIG. 8) from the end part of the light modulation device 341, the heat of the holding section 5 generated due to the light with which the holding section 5 is irradiated becomes hard to be transferred to the light modulation device 341. Specifically, since the liquid intervenes between the irradiated part (mainly the second frame part 82 of the second frame 8) of the holding section 5 irradiated with the light and the light modulation device 341, the heat of the irradiated part generated by the light with which the irradiated part is irradiated becomes hard to be transferred to the light modulation device 341.

Further, since the second flow channel part 62 is provided with the narrowed part 86, the liquid flowing through the second flow channel part 62 (the second path 60B) becomes low in flow rate compared to the configuration not provided with the narrowed part 86. Thus, the temperature distribution of the surface of the light modulation device 341 becomes as follows.

That is, since the first path 60A is formed to be longer than the second path 60B, the liquid flowing through the first path 60A gradually rises in temperature as proceeding along the first flow channel part 61, the third flow channel part 63, and the fourth flow channel part 64. Therefore, the temperature of the liquid flowing through the fourth flow channel part 64 becomes higher than the temperature of the liquid flowing through the first flow channel 61 or the second flow channel 62. In the configuration not provided with the narrowed part 86, the temperature difference becomes conspicuous. Specifically, in the configuration not provided with the narrowed part 86, the region highest in temperature is shifted from the center of the surface toward the fourth flow channel part 64 in the temperature distribution of the surface of the light modulation device 341.

In contrast, according to the present embodiment, since the second flow channel part 62 is provided with the narrowed part 86, the flow rate of the liquid circulating through the second flow channel part 62 becomes lower, and therefore, the heat of the light modulation device 341 is more efficiently transferred. Thus, the temperature difference between the temperature of the liquid flowing through the fourth flow channel part 64 and the temperature of the liquid flowing through the second flow channel part 62 decreases, and therefore, the temperature distribution of the surface of the light modulation device 341 becomes balanced one in which the region highest in temperature comes closer to the center of the surface.

As described above, the light modulation device 341 is held by the holding section 5 provided with the flow channel 6 having an annular shape, and is cooled by the liquid supplied to the flow channel 6.

As described hereinabove, according to the present embodiment, the following advantages can be obtained.

1. The light modulation device 341 is cooled by the liquid flowing through the flow channel 6 having an annular shape and provided to the holding section 5. Further, since the members intervening between the light modulation device 341 and the liquid are reduced compared to the configuration of circulating the liquid using other members (pipe-like members) than the holding section 5, the heat of the light modulation device 341 is efficiently transferred to the liquid. Thus, in the optical device 50, the light modulation device 341 generating heat due to the incident light is efficiently cooled by the liquid supplied to the inflow part 51.

Therefore, since the rise in temperature of the light modulation devices 341 can efficiently be suppressed, the deterioration of the light modulation devices 341 is suppressed, and it becomes possible to provide the optical device 50 capable of surely exerting the optical characteristics provided to the light modulation devices 341.

Further, since the optical device 50 can be formed of a smaller number of components compared to the configuration of circulating the liquid using other members than the holding sections 5, it becomes possible to provide the optical device 50 making it possible to reduce the manufacturing man-hour and the component cost and to reduce the device size.

2. Since the liquid intervenes between the irradiated part of the holding section 5 irradiated with the light and the light modulation device 341, the heat of the irradiated part generated by the light with which the irradiated part is irradiated becomes hard to be transferred to the light modulation device 341. Therefore, it becomes possible to provide the optical device 50 in which the heating of the light modulation device 341 is further suppressed.

3. The flow channel 6 having an annular shape is constituted by the first flow channel part 61 through the fourth flow channel part 64. Thus, with respect to the light modulation device 341 having the optically effective area (the image forming area) having a rectangular shape, it becomes possible to dispose the flow channel 6 closely to the optically effective area. Therefore, since it becomes possible to more efficiently transfer the heat of the light modulation device 341 to the liquid, it becomes possible to provide the optical device 50 capable of more strongly suppressing the rise in temperature of the light modulation device 341.

4. Since in the holding section 5, the inflow part 51 and the outflow part 53 are disposed on the same side with respect to the flow channel forming part 52, the tubular members 44 to be connected to the inflow part 51 and the outflow part 53 can compactly be disposed. Therefore, it becomes possible to provide the optical device 50 capable of making a contribution to the miniaturization of the projector 1.

5. The holding section 5 is formed of the first frame 7 and the second frame 8 connected to each other. Thus, even in the configuration of having the flow channel 6 through which the liquid circulates, it is possible to form the holding section 5 with easy working, and while suppressing the increase in manufacturing man-hour.

6. The inner circumferential edge side of the flow channel forming part 52 having the annular shape is formed by connecting the second uprise part 81 having a plate-like shape to the first uprise part 71 having a plate-like shape.

Further, the flow channel 6 is disposed on the outer side of the second uprise part 81. Thus, it becomes possible to form the flow channel 6 closely to the optically effective area of the light modulation device 341. Therefore, it becomes possible to provide the optical device 50 in which the light modulation device 341 is effectively cooled while easily forming the flow channel 6 even in the configuration of forming the holding section 5 with the two members (the first frame 7, the second frame 8).

7. The first frame 7 and the second frame 8 are bonded to each other with brazing or welding. Thus, the first frame 7 and the second frame 8 are surely bonded to each other, and it becomes possible to form the holding section 5 while suppressing the growth in size.

8. Since the light modulation device 341 as the optical element is efficiently cooled by the liquid having flowed into the holding section 5, and is therefore prevented from rising in temperature. Therefore, it becomes possible to provide the optical device 50 provided with the light modulation device 341 for exerting the own optical characteristics for a long period of time to modulate the incident light.

9. Since the projector 1 is provided with the optical device 50 and the liquid cooling device 4, even in the configuration provided with the light source 311 for emitting high-intensity light, the light modulation device 341 is efficiently cooled, and projection of bright images and images good in quality becomes possible for a long period of time.

Further, since the degree of freedom of the shape of the flow channel 6 can be increased compared to the configuration of circulating the liquid using other members than the holding section 5, it becomes possible to circulate the liquid with low pressure. Thus, it becomes possible to achieve miniaturization and reduction in power of the liquid pressure-feeding section 41 for circulating the liquid.

Further, since it is possible to circulate the liquid with low pressure, it becomes possible to prevent the volatilization and the leakage of the liquid from the connection section between the members in the circulation channel 4F. Thus, it is possible to prevent the liquid from adhering to other members in the projector 1, and at the same time it becomes possible to adopt a configuration provided with a small amount of liquid. Therefore, it becomes possible to provide the projector 1 provided with the liquid cooling device 4 small in size and low in power consumption.

It should be noted that the invention is not limited to the embodiment described above, but a variety of modifications or improvements can be provided to the embodiment described above. Some modified examples will be described below.

Modified Example 1

Although in the embodiment described above, the light modulation device 341 is configured as the optical element held by the holding section 5 through which the liquid circulates, the optical element is not limited to the light modulation device 341, and it is also possible to configure other optical components as the optical element. As the optical element, there can be cited, for example, the incident-side polarization plate 342 and the exit-side polarization plate 343. Further, it is also possible to adopt a configuration in which the optical unit 3 is provided with a wave plate, a compensation element for compensating the phase difference of the light, and so on, and the wave plate, compensation element, or the like is configured as the optical element.

Modified Example 2

Although the holding section 5 of the embodiment described above is configured so that a part of the flow channel 6 overlaps the light modulation device 341 when viewed from a direction along the optical axis 34A, it is also possible to configure the holding section 5 so that the entire flow channel 6 overlaps the light modulation device 341.

Modified Example 3

Although in the optical device 50 of the embodiment described above, the flow channel forming part 52 is disposed on the light incident side of the light modulation device 341, it is also possible to adopt a configuration provided with a flow channel forming part disposed on the light exit side of the light modulation device 341. Further, it is also possible to adopt a configuration in which flow channel forming parts are disposed on the both sides (the light incident side and the light exit side) of the light modulation device 341.

Modified Example 4

Although the holding section 5 of the embodiment described above has the narrowed part 86, it is also possible to configure the holding part not provided with the narrowed part 86.

Modified Example 5

Figure 10:
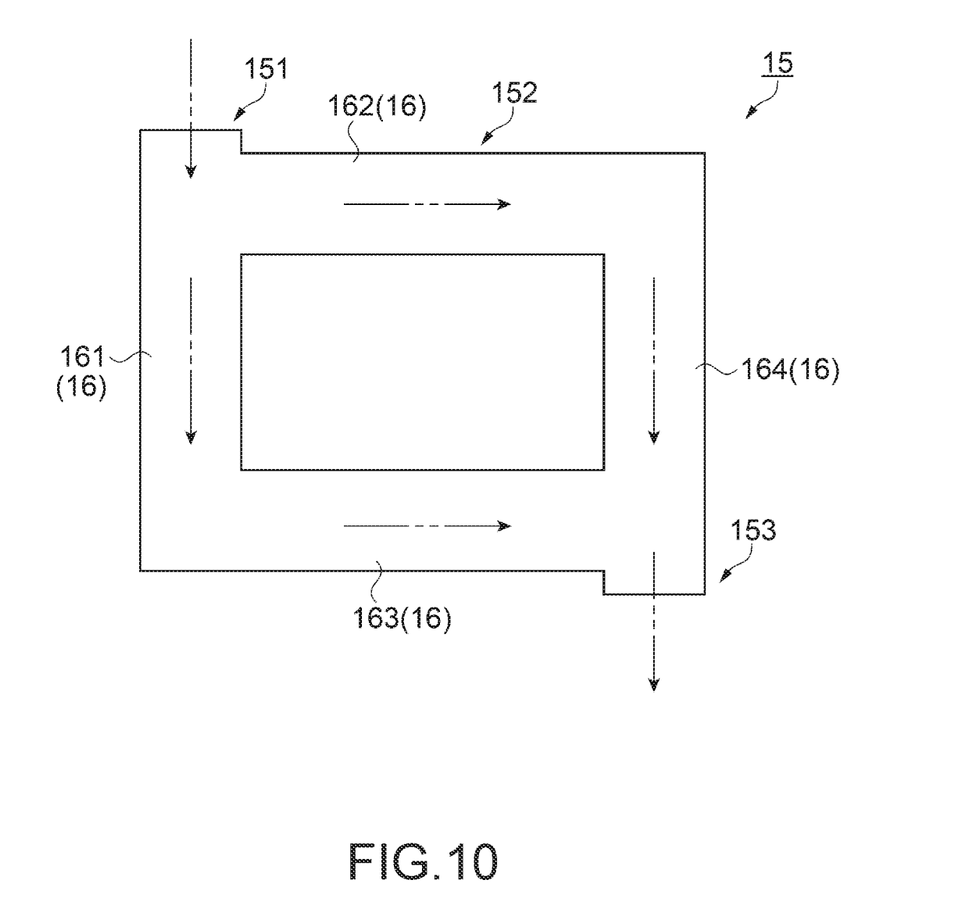
FIG. 10 is a plan view schematically showing the holding section of a modified example.

Although in the holding section 5 of the embodiment described above, the inflow part 51 and the outflow part 53 are disposed on the same side with respect to the flow channel forming part 52, the positions of the inflow part 51 and the outflow part 53 are not limited to such positions. FIG. 10 is a plan view schematically showing a holding section 15 as an example of the present modified example.

As shown in FIG. 10, the holding section 15 is provided with an inflow part 151, a flow channel forming part 152, and an outflow part 153, and the outflow part 153 is disposed at a diagonal position to the inflow part 151 with respect to the flow channel forming position 152. Further, in the flow channel forming part 152, there is disposed a flow channel 16 having an annular shape.

The flow channel 16 having an annular shape has a first flow channel part 161 through a fourth flow channel part 164 corresponding to the positions of the first flow channel part 61 through the fourth flow channel part 64 in the flow channel 6 of the embodiment described above.

In the case of this configuration, the narrowed part 86 of the embodiment described above is not provided, and the flow direction of the liquid in the fourth flow channel part 164 is the opposite direction (the downward direction) to the flow direction (the upward direction) of the liquid in the fourth flow channel part 64 of the embodiment described above. Specifically, the liquid having flowed in through the inflow part 151 partially flows through the first flow channel part 161 and the third flow channel part 163 (the first path), and the rest flows through the second flow channel part 162 and the fourth flow channel part 164 (the second path), and then the both are combined with each other to outflow through the outflow part 153.

According to this configuration, since the length of the first path and the length of the second path are roughly equal to each other, the heat from the optical element is roughly equally transferred to the liquid having flowed through the respective paths, and the optical element is roughly evenly cooled in the entire circumference of the optically effective area.

Modified Example 6

Although the holding section 5 of the embodiment described above is formed of the two members (the first frame 7, the second frame 8) combined with each other, it is also possible to configure the holding section with one member using metal powder or the like and a three-dimensional object shaping device such as a 3D printer. In the case of this holding section, since the inner circumferential edge of the flow channel forming part can be formed thinner than the thickness (the thickness of the first uprise part 71 and the second uprise part 81) thereof in the embodiment described above, it becomes possible to make the flow channel closer to the optically effective area. Further, since the end part 851 in the embodiment described above becomes unnecessary, it becomes to realize the holding section smaller in size.

Modified Example 7

Although the light modulation device 341 (the optical element) of the embodiment described above is held by the holding section 5 using an adhesive, this configuration is not a limitation. For example, it is also possible to adopt a configuration in which there is provided a holding member disposed on the opposite side to the holding section 5 of the optical element, and the optical element is held by clamping the optical element with the holding section 5 and the holding member.

Modified Example 8

Although the liquid cooling device 4 of the embodiment described above is provided with the tank 42, it is also possible to adopt a configuration not provided with the tank 42.

Modified Example 9

Although the light source device 31 of the embodiment described above is configured including the light source 311 of a discharge type, light source is not limited to the discharge type, and it is also possible to adopt a configuration provided with a lamp of other types, a solid-state light source such as a light emitting diode or a laser, or the like.

Further, although the optical unit 3 of the embodiment described above is configured so that the direction in which the light source device 31 emits the light and the direction in which the projection optical device 35 performs the projection are the same as each other as shown in FIG. 1, it is also possible to configure the optical unit so that the direction in which the light source device 31 emits the light and the direction in which the projection optical device 35 performs the projection are different from each other.

Modified Example 10

Although the projector 1 according to the embodiment described above adopts a so-called three-panel system provided with the three light modulation devices 341R, 341G, and 341B corresponding respectively to the R light, the G light, and the B light, the invention is not limited thereto, but a single-panel system can also be adopted, or there can also be adopted a configuration provided with two, four or more light modulation devices.

Further, although the light modulation device 341 of the embodiment described above is configured including the liquid crystal panel 340 of the transmissive type, it is also possible to adopt a configuration in which the light modulation device is formed of a reflective liquid crystal panel. Further, those using a micromirror light modulation device such as digital micromirror device (DMD) as the light modulation device can also be adopted.

The entire disclosure of Japanese Patent Application No. 2016-228642, filed Nov. 25, 2016 is expressly incorporated by reference herein.

What is claimed is:

1. An optical device comprising:
   an optical element disposed on an optical axis of incident light; and
   a holding section configured to hold the optical element, wherein the holding section includes
      an inflow part to which a liquid supplied from an outside of the holding section inflows,
      a flow channel forming part disposed along a circumferential edge of the optical element so as to have an annular shape, and having a flow channel through which the liquid flowed from the inflow part circulates, and
      an outflow part from which the liquid having flowed through the flow channel outflows to the outside of the holding section,
   wherein the holding section includes a first frame and a second frame disposed so as to be opposed to each other in a direction along the optical axis, and
   wherein the flow channel is formed of the first frame and the second frame bonded to each other,
   wherein the first frame includes
      a first frame part having a first opening part through which the light passes, and extending in a direction crossing the optical axis, and
      a first uprise part formed so as to rise from an edge part of the first opening part toward the second frame,
   wherein the second frame includes
      a second frame part having a second opening part into which the first uprise part is inserted, and disposed so as to be opposed to the first frame part via a space, and
      a second uprise part formed so as to rise from an edge part of the second opening part toward the first frame, and disposed so as to overlap the first uprise part in a direction crossing the optical axis,
   wherein the flow channel is disposed between the first frame part and the second frame part,
   wherein the second uprise part constitutes an inner circumference of the flow channel forming part having the annular shape, and
   wherein the first uprise part includes a first uprise part surface extending longitudinally, and the first uprise part surface directly contacts the second uprise part surface.

2. The optical device according to claim 1,
   wherein the flow channel forming part is disposed on a light incident side of the optical element, and
   wherein the flow channel is disposed so as to at least partially overlap the optical element in a direction along the optical axis.

3. The optical device according to claim 1,
   wherein the flow channel includes a first flow channel part configured to circulate, in a first direction, a part of the liquid flowed from the inflow part, a second flow channel part configured to circulate, in a second direction crossing the first direction, a rest of the liquid flowed from the inflow part, a third flow channel part configured to circulate, in the second direction, a liquid flowed through the first flow channel part, and a fourth flow channel part configured to circulate, in a third direction opposite to the first direction, a liquid flowed through the third flow channel part, and wherein the outflow part outflows a liquid obtained by combining a liquid circulated through the second flow channel part and a liquid circulated through the fourth flow channel part.

4. The optical device according to claim 1,
wherein the first frame and the second frame are bonded to each other with one of brazing and welding.

5. The optical device according to claim 1,
wherein the optical element is a light modulation device configured to modulate the incident light.

6. A projector comprising:
a light source configured to emit light;
the optical device according to claim 1, which the light emitted from the light source enters;
a projection optical device configured to project an image corresponding to light emitted from the optical device; and
a liquid cooling device configured to circulate the liquid through the optical device.

7. A projector comprising:
a light source configured to emit light;
the optical device according to claim 2, which the light emitted from the light source enters;
a projection optical device configured to project an image corresponding to light emitted from the optical device; and
a liquid cooling device configured to circulate the liquid through the optical device.

8. A projector comprising:
a light source configured to emit light;
the optical device according to claim 3, which the light emitted from the light source enters;
a projection optical device configured to project an image corresponding to light emitted from the optical device; and
a liquid cooling device configured to circulate the liquid through the optical device.

9. A projector comprising:
a light source configured to emit light;
the optical device according to claim 4, which the light emitted from the light source enters;
a projection optical device configured to project an image corresponding to light emitted from the optical device; and
a liquid cooling device configured to circulate the liquid through the optical device.

10. A projector comprising:
a light source configured to emit light;
the optical device according to claim 5, which the light emitted from the light source enters;
a projection optical device configured to project an image corresponding to light emitted from the optical device; and
a liquid cooling device configured to circulate the liquid through the optical device.

* * * * *